United States Patent [19]

Kuwamoto et al.

[11] Patent Number: 4,810,589
[45] Date of Patent: Mar. 7, 1989

[54] STEEL FOIL HAVING EXCELLENT SHIELDING CHARACTERISTICS TO ELECTROMAGNETIC WAVES

[75] Inventors: Hiroshi Kuwamoto; Masaharu Jitsukawa; Yoshihiro Hosoya, all of Fukuyama, Japan

[73] Assignee: Nippon Kokan Kabushiki Kaisha, Tokyo, Japan

[21] Appl. No.: 185,025

[22] Filed: Apr. 22, 1988

Related U.S. Application Data

[63] Continuation-in-part of Ser. No. 37,103, Apr. 10, 1987, abandoned, which is a continuation of Ser. No. 836,544, Mar. 5, 1986, abandoned.

[51] Int. Cl.$^4$ .......................... H05K 9/00; C21D 9/46
[52] U.S. Cl. .................................... 428/606; 148/320; 174/35 MS
[58] Field of Search ................... 428/606; 174/35 MS; 148/36, 320

[56] References Cited

U.S. PATENT DOCUMENTS 2,706,329  4/1955  Hespenheide ...................... 428/606
3,629,760  12/1977  Seitanakis ...................... 174/35 MS

FOREIGN PATENT DOCUMENTS 130200  10/1980  Japan .

OTHER PUBLICATIONS

Brick et al., Structure and Properties of Engineering Materials, 4th Ed., McGraw-Hill, Inc., 1977, p. 13.
Krause, George, Principles of Heat Treatment of Steel, American Society for Metals, 1980, p. 178.
"Material for Magnetic and Electromagnetic Shielding", Chemical Abstracts 94:55762w, 1980.
Electronic Equipment–Jun. 1957, pp. 20–21.

Primary Examiner—John J. Zimmerman
Attorney, Agent, or Firm—Moonray Kojima

[57] ABSTRACT

An ultrathin steel foil which is suited for use as an electromagnetic wave shielding material and which is excellent in shielding properties, is provided by cold rolling to be 31% to 90% reduction and anneal at 600° to 950° C. for 1 hour of a steel material having specific chemical composition including C of less than 0.01% and specified grain diameter of between 20 to 80 μm, and thicknesses of between 20 to 100 μm.

3 Claims, 3 Drawing Sheets

FIG_1
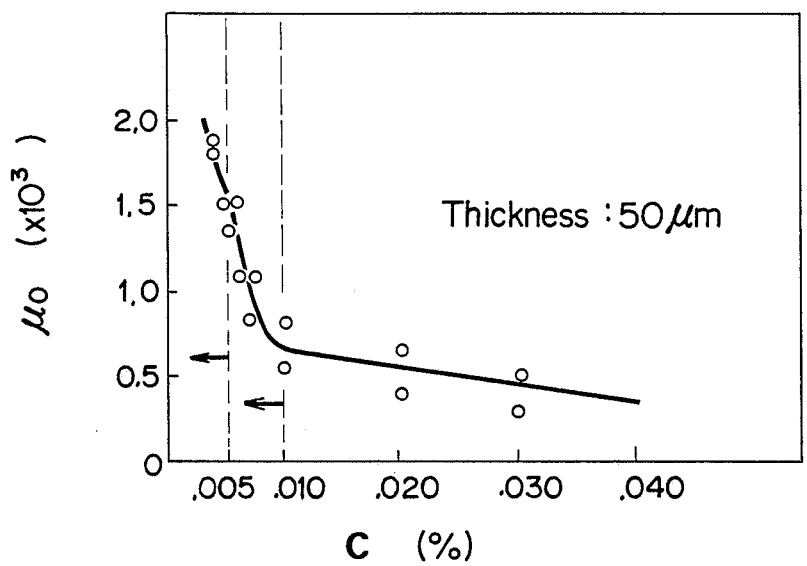
FIG_2
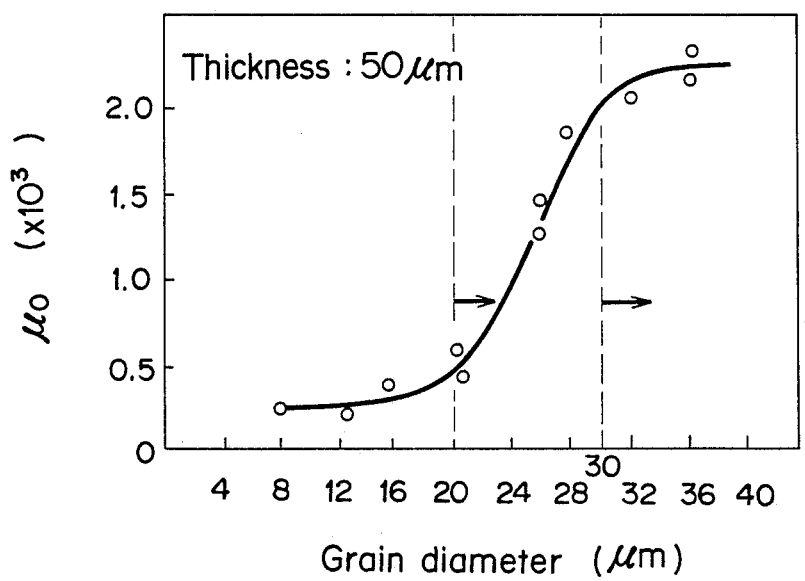

FIG_3
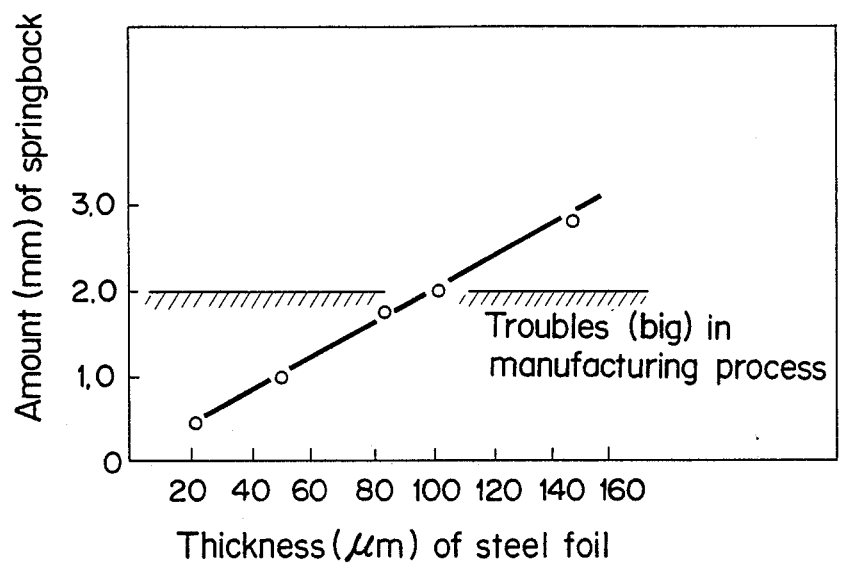
FIG_4
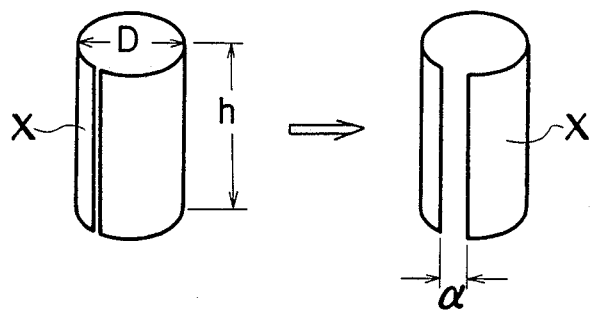

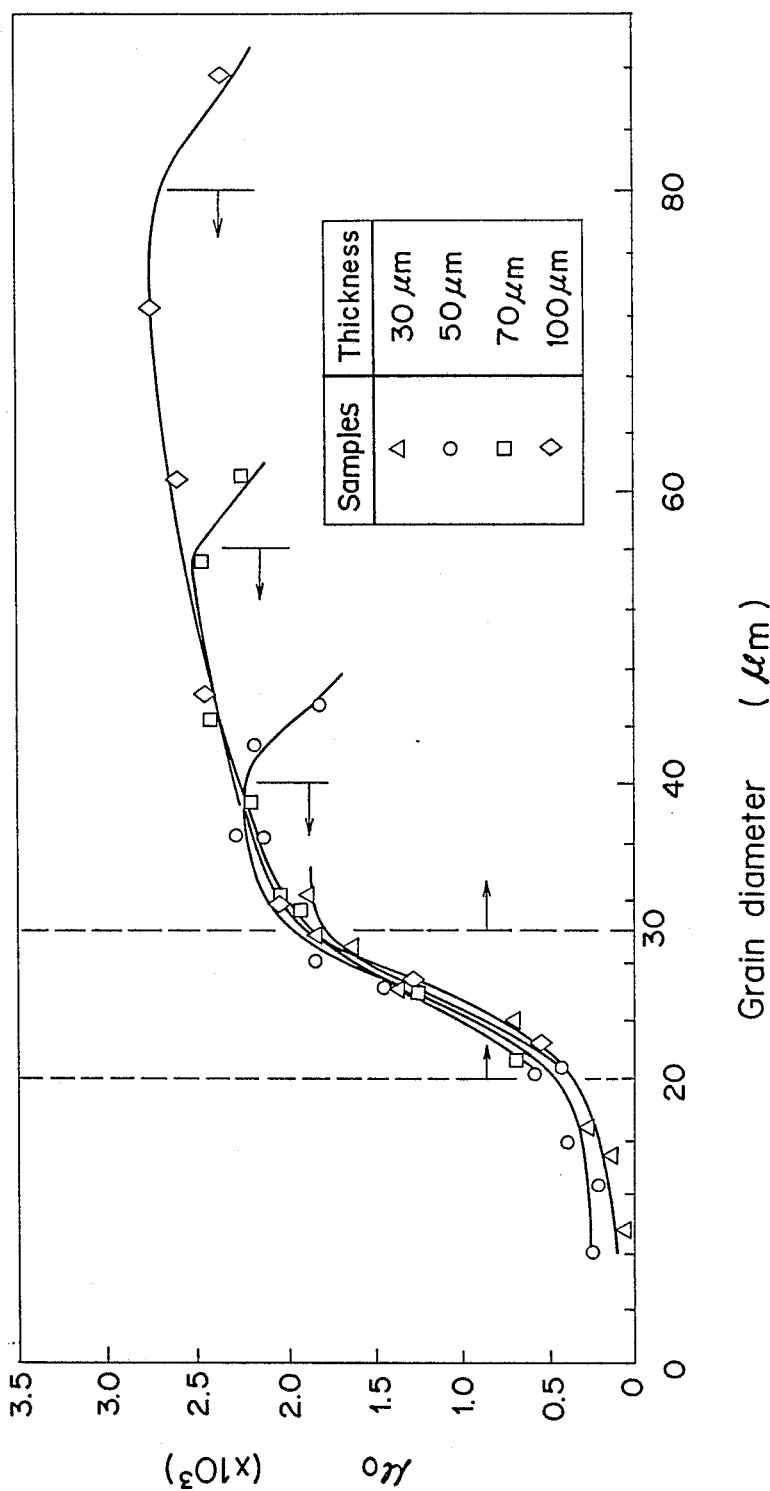

STEEL FOIL HAVING EXCELLENT SHIELDING CHARACTERISTICS TO ELECTROMAGNETIC WAVES

This is a continuation-in-part of Ser. No. 37,103 filed Apr. 10, 1987, which was a continuation of Ser. No. 836,544 filed Mar. 5, 1986, both of which are now abandoned.

BACKGROUND FOF THE INVENTION

1. Field of Invention

This invention relates to an ultrathin steel foil which is suited for use as an electromagnetic shielding material and which has excellent shielding characteristics to electromagnetic waves.

2. Description of Prior Art

Steel foils have been used in computers, etc, for avoiding erroneous operation due to external magnetic waves, for protecting electromagnetic recording data, and as various kinds of shielding materials for protecting against sources of electromagnetic waves.

There are known electromagnetic shielding materials which are coated with conductive paints on plastic base sheets, and such materials which are mixed with metallic powders or chips into the plastic materials.

However, the former is difficult to process into a base sheet. The base sheet is low in shielding effect because it has not electromagnetic wave shielding characteristics, and the conductive paint involves high cost. On the other hand, the latter also presents difficulties. For example, since the metallic powders or chips are mixed into the plastic materials, the powders or chips are exposed at the surfaces of the resulting products. Also, anti-shock properties are deteriorated. In addition, it is necessary to mix large amounts of metallic powders or chips to provide uniform shielding effect, thus resulting in high cost.

In view of the foregoing circumstances, there is a need for shielding materials which are lower in cost than conventional materials, have uniform shielding effect, and may be easily applied to various parts of machinery, etc.

SUMMARY OF THE INVENTION

The invention achieves the aforementioned and other objects by cold rolling a steel material to a specific degree with the material having a specific chemical composition and a specific range of grain sizes to obtain a steel foil of specific range of thicknesses, which has excellent properties as an electromagnetic wave shielding material.

The electromagnetic steel sheet of 3% Si has been known commercially as having excellent electromagnetic characteristics, and has been broadly used as cores for coils. However, disadvantageously, this kind of steel sheet is difficult to be cold rolled, and hence requires many intermediate treatments for producing steel foils, and accordingly is very expensive. Furthermore, a problem arises about making it into an ultrathin steel foil.

The inventors have developed a material which is low in cost, excellent in electromagnetic shielding properties and easy to process into ultrathin steel foils.

The electromagnetic wave shielding properties S is defined below, taking as an example, a tubular shielding material, and the larger is S, the better is the shielding effect.

$$S(dB) = R + A + B \quad (1)$$

wherein, D is the diameter of the crystal grain; R is the loss by reflection of energy (dB) of the electromagnetic wave when it passes through the shielding material; A is the loss by absorption of energy (dB) of the electromagnetic wave when it passes through the shielding material; and B is the inner reflection of the shielding plate (dB).

Thus, the loss of energy of the electromagnetic wave is large when shielding property is good. Generally, $R + A >> B$. R and A are expressed as follows:

$$A = K_I \sqrt{fG\mu} \quad (2)$$

$$R = K_{II} \sqrt{\frac{\mu f}{G}} \quad (3)$$

wherein $\mu$ is magnetic permeability; f is frequency; G is ratio of conductivity when conductivity of Cu is 1; $K_I$ and $K_{II}$ are constants; and t is thickness of the sheet.

As can be seen from the equations (1), (2) and (3), the larger is the magnetic permeability $\mu$, the larger is the quantity $R+A$, and the better is the shielding effect. Also, the greater is the thickness t, A becomes larger and the shielding effect is increased. But, if the thickness t is too large, the workability is decreased. Thus, overly large thickness is not practical.

An important consideration is to improve the magnetic permeability to a point of increasing both R and A without spoiling the workability. The ranges set forth below accomplish the goals desired.

This invention aims to improve magnetic permeability and other desired properties of a steel foil, by specifying the chemical composition as consisting of $C \leq 0.010\%$, more preferably 0.005% or less; $Mn \leq 0.20\%$; $P \leq 0.020\%$; $S \leq 0.02\%$; $Al \leq 0.040\%$, $N \leq 0.004\%$, and remainder Fe and unavoidable impurities by cold rolling and annealing, and further cold rolling 31 to 90% to specify a thickness of a steel foil to be 20 to 100 $\mu$m and annealing at a temperature of between 600° and 950° C. to specify the diameter of crystal grains to be 20 to 80 $\mu$m, preferably more than 30 $\mu$m.

BRIEF DESCRIPTION OF THE DRAWING

FIG. 1 is a graph depicting the relation between C content and magnetic permeability for a sample thickness of 50 $\mu$m.

FIG. 2 is a graph depicting relation between grain diameter and magnetic permeability for a sample thickness of 50 $\mu$m.

FIG. 3 is a graph depicting relation between thickness of the steel foil and amount of spring back.

FIG. 4 is an explanatory view of the spring back.

FIG. 5 is a graph depicting the relation between grain diameter and magnetic permeability for samples having thicknesses ranging from 30 $\mu$m to 100 $\mu$m.

DETAILED DESCRIPTION OF PREFERRED EMBODIMENTS

As seen from FIG. 1, the smaller the C content, the greater the permeability $\mu$, especially the permeability is increased when the C content is less than 0.010%. Thus, the C content is limited to no more than 0.010%.

If greater improvement of permeability is desired, a C content of 0.005% or less is preferred.

Since the elements of Mn, P, Al, N and S adversely influence the magnetic properties, the amounts to be used of such elements should be as small as possible, with the smaller amounts to be preferred. However, if the amounts are extremely small, special treatment would be required and production costs would be high and not practical. Thus, in this invention, the upper limits of these elements have been determined to be as follows: Mn≦0.20%; P≦0.02%; S≦0.020%; Al≦0.040%; and N≦0.004%, remainder being Fe and C as in the amounts specified in this invention.

FIG. 2 shows the relation between diameter $\bar{d}$ of the grain size and permeability $\mu$ for a sample thickness of 50 μm. The larger is $\bar{d}$, the permeability $\mu$ is increased, and especially when $\bar{d} \geq 20$ μm, the permeability $\mu$ is increased.

The magnetic permeability is preferable at grain diameters of more than 30 μm, and at about 40 μm magnetic permeability is saturated. This tells that if the sheet has a thickness of 100 μm, the upper limit of grain diameter is 80 μm. (Note: FIG. 2 is for thickness of 50 μm) Thus, 2×50 μm=100 μm; and 2×40μm=80 μm in grain diameter.

The thickness of the steel foil is between 2 μm and 100 μm, which is referred to as ultrathin foil in the art. If the thickness exceeds this upper limit, it would be difficult to attach the foil to machine as a simple sheet layer, such as a label or the like.

FIG. 3 is a graph showing the relation between the thickness of the foil and the amount of spring back. The amount of spring back is, as shown in FIG. 4, an opening amount α of a connecting part after the foil X has been formed as a magnetic shielding cylinder of a diameter of D=30 mm and a height of h=50 mm.

As seen in FIG. 3, if the thickness is more than 10 μm, spring back α would be larger, so that difficulties are caused in the production process, and hence such thickness greater than 100 μm would not be practical. Thus, the upper limit of the foil is 100 μm. On the other hand, if the lower limit of thickness is less than 20 μm, the value of A (energy absorption) would be smaller as shown in the above equation (2), and it would be difficult to maintain the desired shielding properties concurrently with improvement of magnetic permeability alone. Hence, the lower limit of thickness is determined to be 20 μm.

The steel material of the above controlled composition is subjected to a cold rolling and an annealing, and the thus treated steel material is subjected to a further cold rolling 31 to 90% to specify a thickness of a steel foil to be 20 to 100 μm and to an annealing at a temperature between 600° and 950° C. to specify the diameters of crystal grains to be 20 to 80 μm, preferably more than 30 μm.

The electromagnetic properties of the steel foil are compared with comparative examples in the below table, wherein Hc is the coercive force, V is the final thickness, X is the crystal grain size, W is the cold rolling reduction, and $\mu_o$ is the initial permeability. In this table, the steel foils according to the invention show high permeability for the samples which were cold rolled between 31 to 90%, have a grain size of 20 to 80 μm, a thickness of 20 to 100 μm, and were annealed at between 600° C. to 950° C. for one hour.

| No. | | C (%) | V (μm) | W (%) | Annealing condition | X μm | Hc | $\mu_o$ |
|---|---|---|---|---|---|---|---|---|
| 1 | Comp. | 0.030 | 50 | 70 | 850° C. × 1 hr | 18 | 1.62 | 500 |
| 2 | Inven. | 0.005 | 50 | 70 | 850° C. × 1 hr | 26 | 0.85 | 1540 |
| 3 | Inven. | 0.003 | 50 | 70 | 850° C. × 1 hr | 28 | 0.40 | 1900 |
| 4 | Comp. | 0.003 | 200 | 70 | 850° C. × 1 hr | 26 | 1.40 | 1220 |
| 5 | Inven. | 0.003 | 100 | 70 | 850° C. × 1 hr | 30 | 0.41 | 1850 |
| 6 | Inven. | 0.003 | 50 | 70 | 850° C. × 1 hr | 32 | 0.40 | 1900 |
| 7 | Inven. | 0.003 | 30 | 70 | 850° C. × 1 hr | 32 | 0.35 | 1920 |
| 8 | Comp. | 0.003 | 50 | 50 | 850° C. × 1 hr | 10 | 1.03 | 250 |
| 9 | Inven. | 0.003 | 50 | 50 | 850° C. × 1 hr | 28 | 0.54 | 1750 |
| 10 | Inven. | 0.003 | 50 | 70 | 850° C. × 1 hr | 30 | 0.40 | 1900 |
| 11 | Comp. | 0.003 | 50 | 70 | 400 C. × 1 hr | 4 | 5.52 | 100 |
| 12 | Inven. | 0.003 | 50 | 70 | 650° C. × 1 hr. | 22 | 1.56 | 1050 |
| 13 | Inven. | 0.003 | 50 | 70 | 700° C. × 1 hr. | 26 | 0.75 | 1430 |
| 14 | Inven. | 0.002 | 50 | 70 | 850° C. × 1 hr. | 32 | 0.35 | 1950 |

FIG. 5 is similar to FIG. 2 with the magnetic permeability being measured for samples of different thicknesses ranging from 30 μm to 100 μm. Four different samples were prepared having a C content of 0.003%, and the other elements Mn, P, S, Al, N being within the range recited and remainder Fe, and cold rolled to between 31% to 90% and annealed at 850° C. for 1 hour to form the four different samples having thicknesses of 30, 50, 70 and 100 μm. As shown in FIG. 5, the crystal grain diameters for magnetic permeabilities in a range of $0.5 \times 10^3$ $\mu_0$ to saturation of between about $1.8 \times 10^3$ $\mu_0$ to about $2.75 \times 10^3$ $\mu_0$ was 20 to 80 μm.

According to the graph of FIG. 2, a steel foil of 30 μm shows mannetic saturation at grain diameter of about 24 μm; a steel foil of 50 μm shows magnetic permeability saturation for grain diameter of about 40 μm; a steel foil of 70 μm shows magnetic permeability saturation at grain diameter of about 56 μm; and that of 100 μm thickness shows magnetic permeability saturation at about 80 μm.

The larger the grain diameter, the greater the magnetic permeability until saturation. Magnetic permeability is deteriorated by even a slight strain. Especially, if the grain diameter is more than 80% of the thickness, fine bending defects are caused in the foil when it is recoiled after annealing. Also, the magnetic permeability is decreased. Thus, for the range of thicknesses desired, the range of grain sizes is limited to between 20 to 80 μm.

With respect to usage, the steel foil of the invention may be used as a base sheet and coated with an adhesive and then used as a label, or a plurality of laminated foils may be coated with adhesive and then used as a label. If the foil is formed to be in the form of a label, it would have the advantage of being easily attached to various parts of a machine, such as the more inaccessible corners, the outside, the inside, etc.

As mentioned above, the inventive foil has high permeability so that it may be used as an electromagnetic wave shielding material as it is. When it is used as a base sheet to be coated with a paint having electromagnetic properties, a higher shielding effect is obtained.

What is claimed is:

1. A steel foil having excellent shielding properties against electromagnetic waves and consisting of $C \leqq 0.01\%$; $Mn \leqq 0.20\%$; $P \leqq 0.020\%$; $S \leqq 0.020\%$; $Al \leqq 0.040\%$, $N \leqq 0.0040\%$, remainder Fe and unavoidable impurities; and having crystal grains of diameter within the range of 20 to 8 $\mu$m; and having a sheet thickness of between 20 $\mu$m and 100 $\mu$m in that a cold rolled and annealed steel material is cold rolled 31 to 90% and annealed at a temperature between 600° and 950° C.

2. The foil of claim 1, wherein said diameters are more than 30 $\mu$m.

3. The foil of claim 1, wherein the C content is 0.005% or less.